US009419630B2

United States Patent
Potty et al.

(10) Patent No.: US 9,419,630 B2
(45) Date of Patent: Aug. 16, 2016

(54) PHASE SHIFTED COARSE/FINE CLOCK DITHERING RESPONSIVE TO CONTROLLER SELECT SIGNALS

(71) Applicant: Texas Instruments Incorporated, Dallas, TX (US)

(72) Inventors: Sreenath Narayanan Potty, Trivandrum, IN (US); Vivek Singhal, Karnataka (IN); Sumanth Reddy Poddutur, Karnataka (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 14/584,550

(22) Filed: Dec. 29, 2014

(65) Prior Publication Data

US 2016/0191066 A1 Jun. 30, 2016

(51) Int. Cl.
*G06F 1/04* (2006.01)
*H03K 3/00* (2006.01)
*H03L 7/081* (2006.01)
*H03K 3/013* (2006.01)

(52) U.S. Cl.
CPC .............. *H03L 7/0818* (2013.01); *H03K 3/013* (2013.01)

(58) Field of Classification Search
CPC ............... G06F 1/10; G06F 1/04; G06F 1/08; H03K 5/135; G11C 7/22
USPC .......................................................... 327/291
See application file for complete search history.

(56) References Cited

U.S. PATENT DOCUMENTS

| 4,165,490 A * | 8/1979 | Howe, Jr. | ................... | G06F 1/04 327/172 |
| 4,537,203 A * | 8/1985 | Machida | ................... | A61B 5/05 600/547 |
| 8,487,672 B2 * | 7/2013 | Itoh | ............................ | G06F 1/06 327/142 |
| 2012/0154010 A1 * | 6/2012 | Singhal | .................. | H03K 3/017 327/299 |

* cited by examiner

*Primary Examiner* — Lincoln Donovan
*Assistant Examiner* — Diana J Cheng
(74) *Attorney, Agent, or Firm* — Lawrence J. Bassuk; Frank D. Cimino

(57) ABSTRACT

A clock dithering circuit that provides cancellation of digital noise spurs is disclosed. The clock dithering circuit includes a control unit that receives an input clock. An ICG (integrated clock gating) cell receives the input clock and receives an enable signal from the control unit. The ICG cell generates a gated clock. A coarse dither unit receives the gated clock and receives a coarse select signal from the control unit. The coarse dither unit generates a coarse dither clock. A fine dither unit receives the coarse dither clock and receives a fine select signal from the control unit. The fine dither unit generates a fine dither clock.

20 Claims, 5 Drawing Sheets

PHASE SHIFTED COARSE/FINE CLOCK DITHERING RESPONSIVE TO CONTROLLER SELECT SIGNALS

TECHNICAL FIELD

The disclosure relates to clock dithering circuits and more particularly to the use of the clock dithering circuits to reduce digital noise spurs.

BACKGROUND

Several multi-radio systems-on-chip (SoCs) include multiple on-chip radio frequency (RF) circuits that coexist and operate on a single silicon die. Such SoCs include digital circuit as well as analog circuits integrated on the same silicon die. For example, a SoC is designed to accommodate wireless local area network (WLAN) systems, short range wireless communication systems, and frequency modulation (FM) radio systems thereon.

The RF circuits co-existing on the SoC causes interference issues in efficient operation of the SoCs. For example, the digital circuits in the SoC significantly contribute to the interference when the harmonics of the frequencies of a digital clock associated with the digital circuits fall in a band of interest of RF circuits. As such, the RF circuits will not function as expected. In various exemplary scenarios, such harmonics of the frequencies of the digital clock signals are referred to as spurs or spurious signal.

If the spurs caused by digital activity occur in the band of interest of RF circuits on the SoC, they cause degradation in the performance of RF circuits. For example, the spurs change the noise floor, thereby impacting the detection of channel presence. When the location of the interfering frequency band is closely related to the harmonics of the frequencies of the digital clock, choosing the frequency of the digital clock becomes difficult.

SUMMARY

An aspect of the disclosure provides a clock dithering circuit. The clock dithering circuit includes a control unit that receives an input clock. An ICG (integrated clock gating) cell receives the input clock and receives an enable signal from the control unit. The ICG cell generates a gated clock. A coarse dither unit receives the gated clock and receives a coarse select signal from the control unit. The coarse dither unit generates a coarse dither clock. A fine dither unit receives the coarse dither clock and receives a fine select signal from the control unit. The fine dither unit generates a fine dither clock.

BRIEF DESCRIPTION OF THE VIEWS OF DRAWINGS

DETAILED DESCRIPTION OF THE EMBODIMENTS

Figure 1:
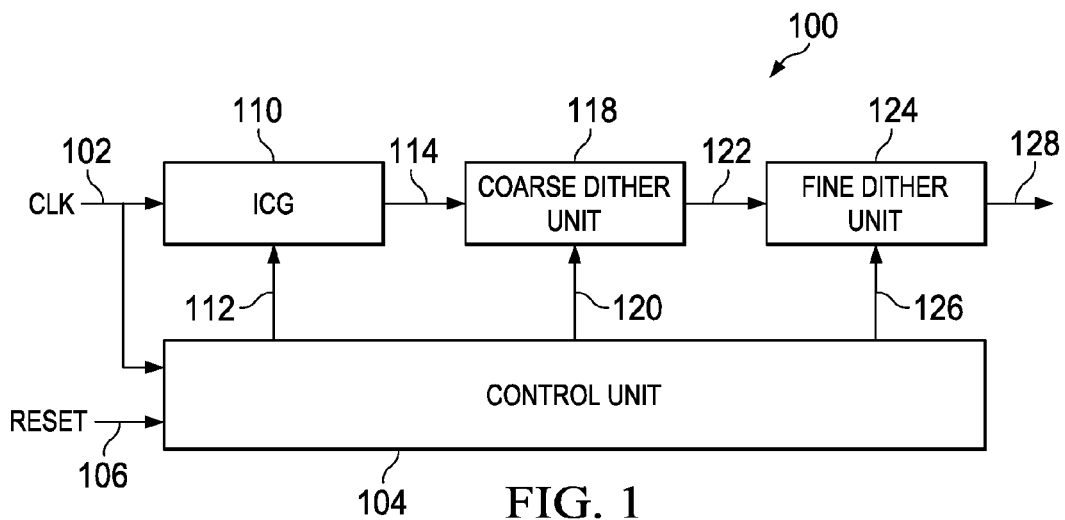
FIG. 1 illustrates a schematic of a clock dithering circuit, according to an embodiment.

FIG. 1 illustrates a schematic of a clock dithering circuit 100, according to an embodiment. The clock dithering circuit 100 includes a control unit 104, an integrated clock gating (ICG) cell 110, a coarse dither unit 118 and a fine dither unit 124. The control unit 104 receives an input clock CLK 102. The control unit 104 also receives a reset signal 106. The ICG cell 110 receives the input clock CLK 102. The ICG cell 110 also receives an enable signal 112 from the control unit 104. The ICG cell 110 generates a gated clock 114.

The coarse dither unit 118 is coupled to the ICG cell 110 and receives the gated clock 114. The coarse dither unit 118 also receives a coarse select signal 120 from the control unit 104. The coarse dither unit 118 generates a coarse dither clock 122. The fine dither unit 124 is coupled to the coarse dither unit 118 and receives the coarse dither clock 122. The fine dither unit 124 also receives a fine select signal 126 from the control unit 104. The fine dither unit 124 generates a fine dither clock 128. In one version, the clock dithering circuit 100 includes one or more coarse dither units and/or one or more fine dither units. The clock dithering circuit 100 may include one or more additional components known to those skilled in the relevant art and are not discussed here for simplicity of the description.

The operation of the clock dithering circuit 100 illustrated in FIG. 1 is explained now. The ICG cell 110 receives the input clock CLK 102 and the enable signal 112. The ICG cell 110 generates the gated clock 114 when the enable signal 112 is at logic high. In one version, the ICG cell 110 generates the gated clock 114 when the enable signal 112 is at logic low. The enable signal 112 is configured to gate at least one positive edge of the input clock CLK 102 to generate the gated clock 114.

In one example, when the input clock CLK 102 has N positive edges, the ICG cell 110 gate M positive edges of the input clock CLK 102 such that the generated gated clock 114 has N−M positive edges in response to the N positive edges of the input clock CLK 102. N and M are integers and M is less than N. In an example, the coarse select signal 120 from the control unit 104 transitions when the input clock CLK 102 is gated i.e. when the enable signal 112 is at logic low and the ICG cell 110 is not generating the gated clock 114. For example, the coarse select signal 120 transitions from 0 degrees to 180 degrees. The coarse select signal 120 provides a coarse delay to the gated clock 114. The coarse dither unit 118 generates the coarse dither clock 122 with N−M positive edges.

The fine select signal 126 from the control unit 104 is provided at each positive edge of the N−M positive edges of the coarse dither clock 122. The fine select signal 126 provides a fine delay to the coarse dither clock 122. The fine delay is less than the coarse delay. In one version, the fine delay is equal to the coarse delay. The fine dither unit 124 generates the fine dither clock 128 with N−M positive edges.

The throughput of the clock dithering circuit 100 is estimated from at least one of the N, M and a frequency of the input clock CLK 102. In one version, the throughput of the clock dithering circuit 100 is defined as $$\text{Throughput} = \left(1 - \frac{M}{N}\right) \times F \quad (1)$$

where, F is a frequency of the input clock CLK 102.

The throughput is maintained above a defined threshold by continuously monitoring a ratio of M and N. The defined threshold is derived from M and N. In an example, N is chosen randomly between a maximum value, Nmax, and a minimum value, Nmin. This is advantageous as it provides more randomness to the generated fine dither clock 128. It also keeps the throughput in a defined range. The defined range is between T1 and T2, defined as $$T1 = \left(1 - \frac{M}{N\max}\right) \times F \quad (2)$$

$$T2 = \left(1 - \frac{M}{N\min}\right) \times F \quad (3)$$

where, Nmax and Nmin are the maximum value and the minimum value of N respectively.

The coarse select signal 120 and the fine select signal 126 combined provide a dither between 0 degrees and 360 degrees to the fine dither clock 128 with respect to the input clock CLK 102. This ensures good suppression of all the harmonics of input clock CLK 102. The clock dithering circuit 100 is a multi-stage clock dithering circuit and dithering of input clock CLK 102 is performed at various stages by the ICG cell 110, the coarse dither unit 118 and the fine dither unit 124. Also, the gating of input clock CLK 102 by the ICG cell 110 followed by a processing in the coarse dither unit 118 ensures that the positive edges of the fine dither clock 128 never come too close.

The clock dithering circuit 100 is independent of PVT (process, voltage and temperature) variation as it allows a dither between 0 degrees and 360 degrees to the fine dither clock 128 with respect to the input clock CLK 102. The clock dithering circuit 100 also maintains the throughput above the defined threshold as discussed in connection with equation 1. The clock dithering circuit 100 achieves minimal STA (static timing analysis) closure overhead even with high dithering. This is because the input clock CLK 102 is gated when the coarse select signal 120 transitions to provide the coarse delay to the gated clock 114.

Figure 2:
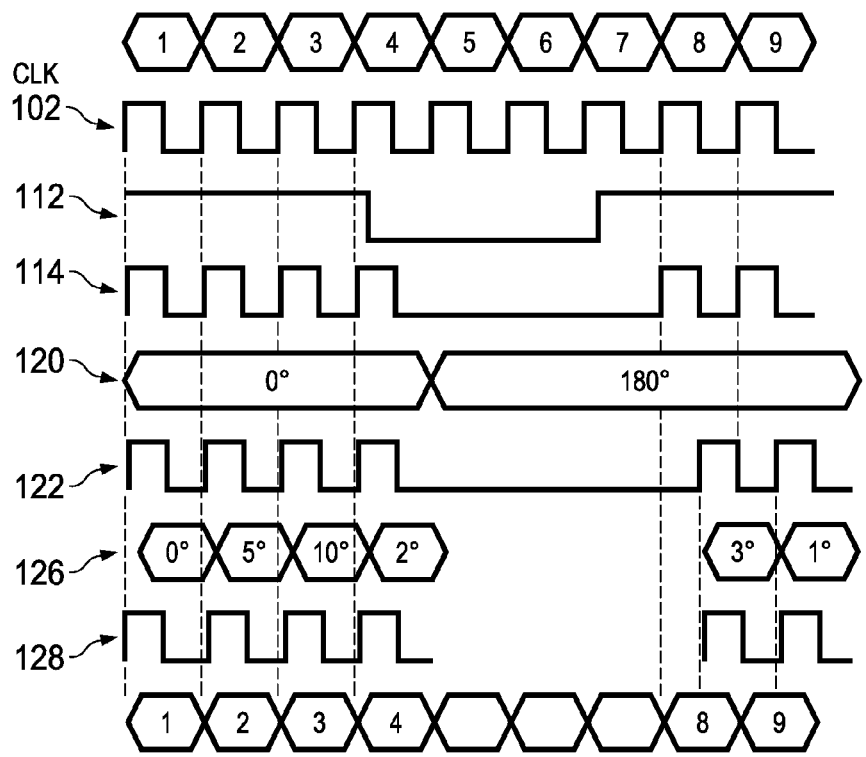
FIG. 2 is a timing diagram to illustrate the operation of the clock dithering circuit, according to an embodiment.

FIG. 2 is a timing diagram to illustrate the operation of the clock dithering circuit 100, according to an embodiment. The input clock CLK 102 is provided to the clock dithering circuit 100. The enable signal 112 is generated by the control unit 104 and provided to the ICG cell 110. The enable signal 112 is configured to gate at least one positive edge of the input clock CLK 102 to generate the gated clock 114.

In the illustrated embodiment, the enable signal 112 gates three positive edges of the input clock CLK 102. The enable signal 112 is at logic low during cycles 5, 6 and 7. The ICG cell 110 generates the gated clock 114 when the enable signal 112 is at logic high. When the enable signal 112 changes from logic low to logic high during cycle 7, the ICG cell 110 generates the gated clock 114. Thus, the input clock CLK 102 has 7 positive edges (N) and the ICG cell gates 3 positive edges (M). Therefore, the gated clock 114 has 4 (N−M) positive edges.

The coarse select signal 120 is provided by the control unit 104 to the coarse dither unit 118. The coarse select signal 120 provided to the coarse dither unit 118 transitions when the input clock CLK 102 is gated. The coarse select signal 120 transitions once during N positive edges of the input clock CLK 102. In one example, the coarse select signal 120 transitions after a fixed time once the input clock CLK 102 is gated, where the fixed time is greater than a maximum coarse delay provided by the coarse dither unit 118. A coarse select signal 120 of 0 degrees is provided during 4 positive edges of the gated clock 114. Thereafter, a coarse select signal 120 of 180 degrees is provided.

Since, the coarse select signal 120 of 0 degrees is provided, the coarse dither clock 122 has same phase as the gated clock 114. However, when the coarse select signal 120 of 180 degrees is provided, a positive edge of the coarse dither clock 122 is phase shifted by 180 degrees with respect to a corresponding positive edge of the gated clock 114.

The fine select signal 126 is provided at each positive edge of the 4 (N−M) positive edges of the coarse dither clock 122. The fine delay is less than the coarse delay. In one version, the fine delay is less than or equal to the coarse delay. As illustrated, a fine delay of 0 degree is provided to a first positive edge and a fine delay of 5 degree is provided to a second positive edge. The values illustrated in the figure are exemplary and are understood not to limit the scope of the present disclosure.

Thus, a positive edge of the fine dither clock 128 is phase shifted by a defined phase with respect to a positive edge of the coarse dither clock 122. The coarse select signal 120 and the fine select signal 126 combined provide a dither between 0 degrees and 360 degrees to the fine dither clock 128 with respect to the input clock CLK 102. This ensures good suppression of all the harmonics of input clock CLK 102.

Figure 3:
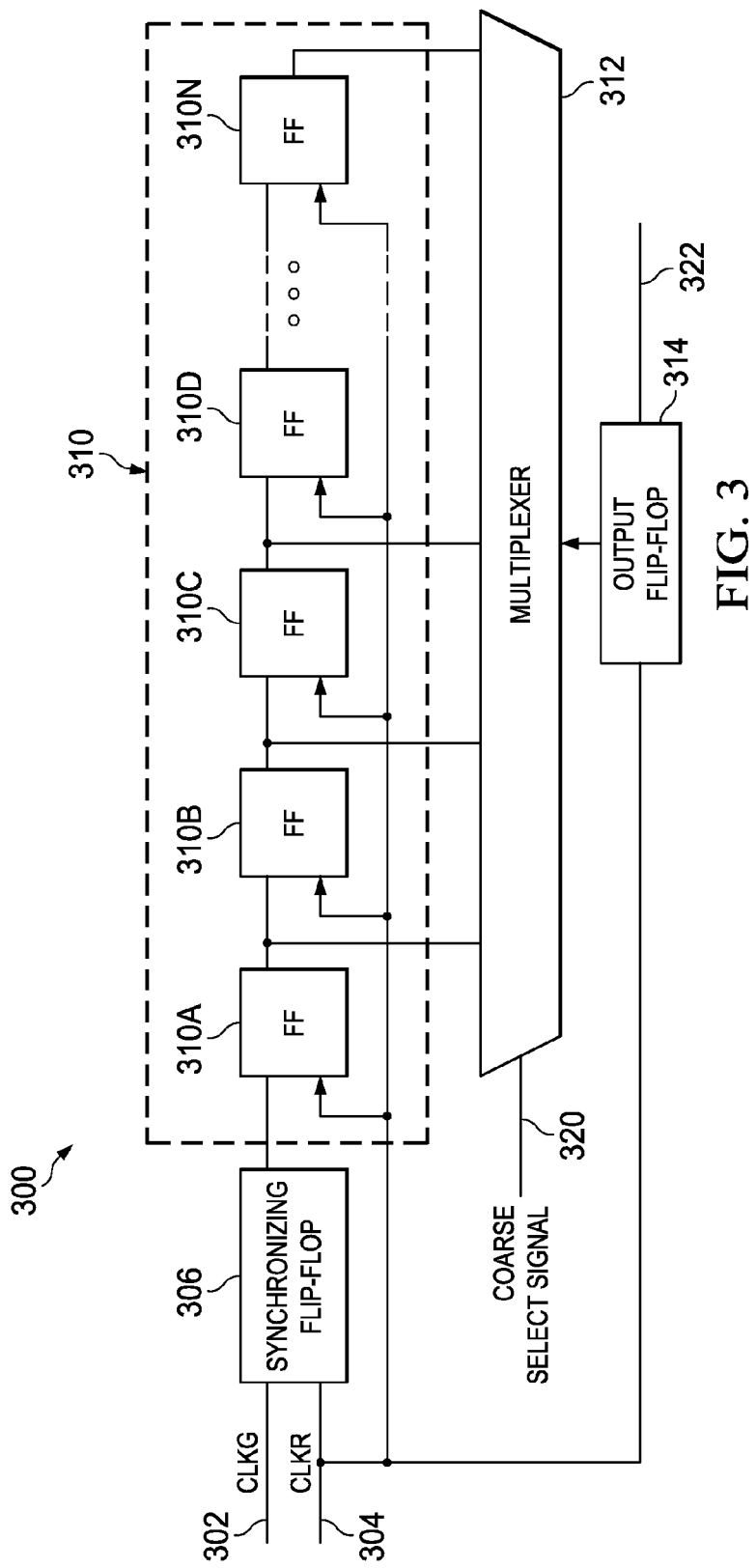
FIG. 3 illustrates a coarse dither unit, according to an embodiment.

FIG. 3 illustrates a coarse dither unit 300, according to an embodiment. The coarse dither unit 300 includes a synchronizing flip-flop 306, one or more delay flip-flops 310, a multiplexer 312 and an output flip-flop 314. The coarse dither unit 300 is analogous to the coarse dither unit 118 in connection and operation. The synchronizing flip-flop 306 receives a gated clock CLKG 302 and a reference clock CLKR 304.

The one or more delay flip-flops 310 include delay flip-flop 310A, 310B, 310C, 310D till 310N. The one or more delay flip-flops 310 are coupled sequentially. The delay flip-flops are represented as FF. Each delay flip-flop of the one or more delay flip-flops receives the reference clock CLKR 304. A first delay flip-flop 310A receives an output of the synchronizing flip-flop 306. A second delay flip-flop 310B receives an output of the first delay flip-flop 310A. Similarly, $N^{th}$ delay flip-flop 310N receives an output of an $(N-1)^{th}$ delay flip-flop.

The multiplexer 312 receives an output of each delay flip-flop of the one or more delay flip-flops 310. The multiplexer 312 also receives a coarse select signal 320. In an example, the coarse select signal 320 is similar to the coarse select signal 120 from the control unit 104 (illustrated in FIG. 1). The output flip-flop 314 receives an output of the multiplexer 312. The output flip-flop 314 also receives the reference clock CLKR 304. The output flip-flop generates a coarse dither clock 322. In one version, the coarse dither clock 322 is similar to the coarse dither clock 122 illustrated in FIG. 1. The coarse dither unit 300 may include one or more additional components known to those skilled in the relevant art and are not discussed here for simplicity of the description.

The operation of the coarse dither unit 300 illustrated in FIG. 3 is explained now. The reference clock CLKR 304, in one example, is of the order of 1.6 GHz and the gated clock CLKG 302 is of the order of 100 MHz. The synchronizing flip-flop 306 is used to match a phase of the gated clock CLKG 302 and the reference clock CLKR 304. The coarse select signal 320 defines a phase shift to be provided to the gated clock CLKG 302. The phase shift is between 0 degrees and 360 degrees and is provided to each positive edge of the gated clock CLKG 302.

The one or more delay flip-flops 310 provide a coarse delay to the gated clock CLKG 302. The multiplexer 312 selects an output of one of the delay flip-flop. The output flip-flop 314 synchronizes the output of the multiplexer 312 with the reference clock CLKR 304 to generate the coarse dither clock 322. As an example if 16 flip flops are used in the one or more delay flip-flops 310, each flip-flop will introduce a time period corresponding 22.5 degrees (1/16*360). Thus the coarse dither unit 300 provides a coarse delay with a resolution of 22.5 degrees.

Figure 4:
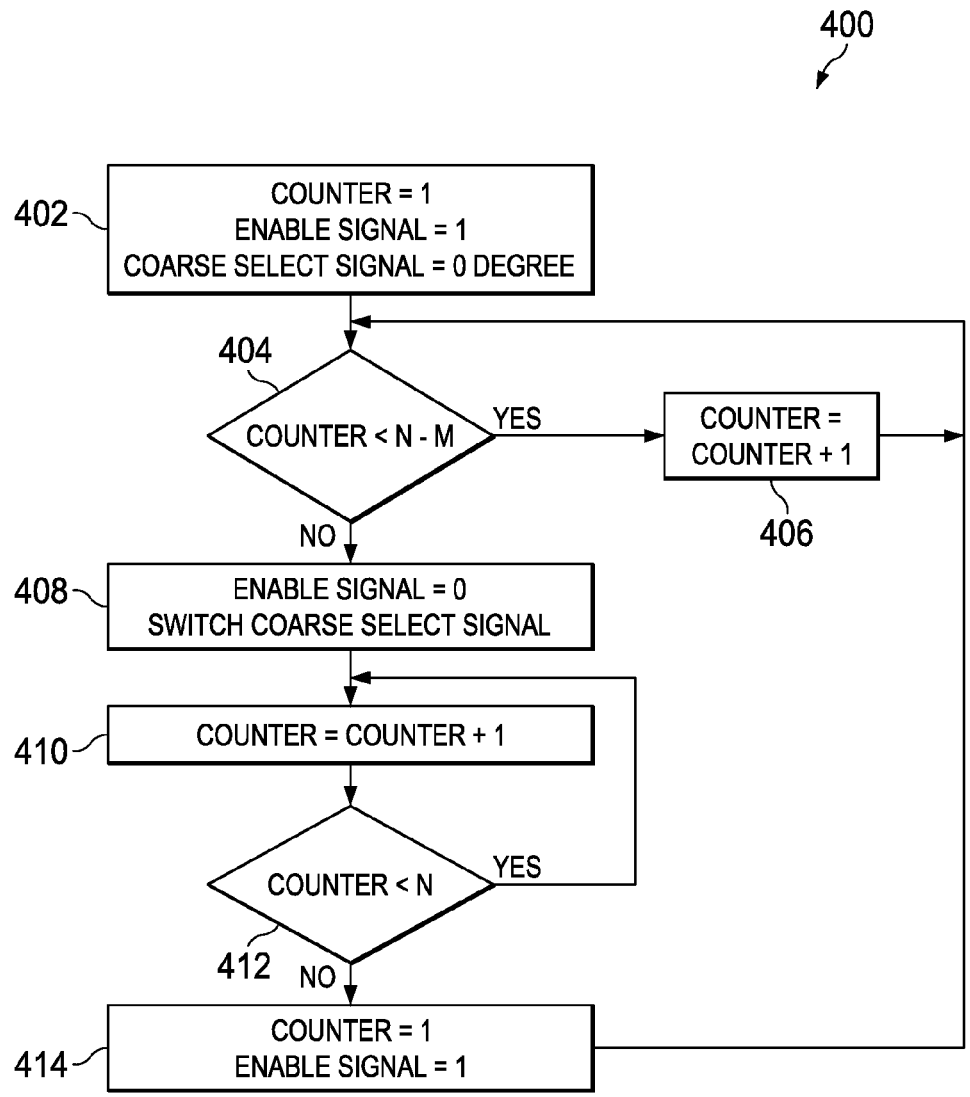
FIG. 4 is a flowchart illustrating a method of generating a gated clock, according to an embodiment.

FIG. 4 is a flowchart 400 illustrating a method of generating a gated clock, according to an embodiment. The flowchart 400 is explained in connection with the clock dithering circuit 100 illustrated in FIG. 1. The flowchart 400 is thus a method followed by the control unit 104. In one example, the flowchart 400 is programmed in the control unit 104. At step 402, a counter is initialized at a value 1. Also the enable signal is at logic high or logic '1'. A coarse select signal of 0 degrees is provided.

When an input clock CLK has N positive edges, M positive edges of the input clock CLK are gated such that the generated gated clock has N−M positive edges in response to the N positive edges of the input clock CLK. N and M are integers and M is less than N. At step 404, the counter is compared to N−M. When counter is less than N−M, a system implementing the method proceeds to step 406. At step 406, the counter is incremented at every positive edge of the input clock CLK.

When counter is greater than or equal to N−M, the enable signal transition from logic high to logic low or logic '0', at step 408. Also, at step 408, the coarse select signal transition in a random manner. The coarse select signal is switch to a defined phase such as 180 degrees. At step 410, the counter in incremented at every positive edge of the input clock CLK. At step 412, the counter is compared to N. If counter is less than N, the system proceeds to step 410 otherwise the system proceeds to step 414.

When the counter is equal to or greater than N, at step 414, the counter is initialized back to the value 1 and the enable signal transitions to logic high or logic '1'. The system thereafter proceeds to step 404. The flowchart 400 provides a method of gating last M positive edges of the N positive edges of the input clock CLK as well the coarse select signal 120 transitions when the input clock CLK is gated.

Figure 5:
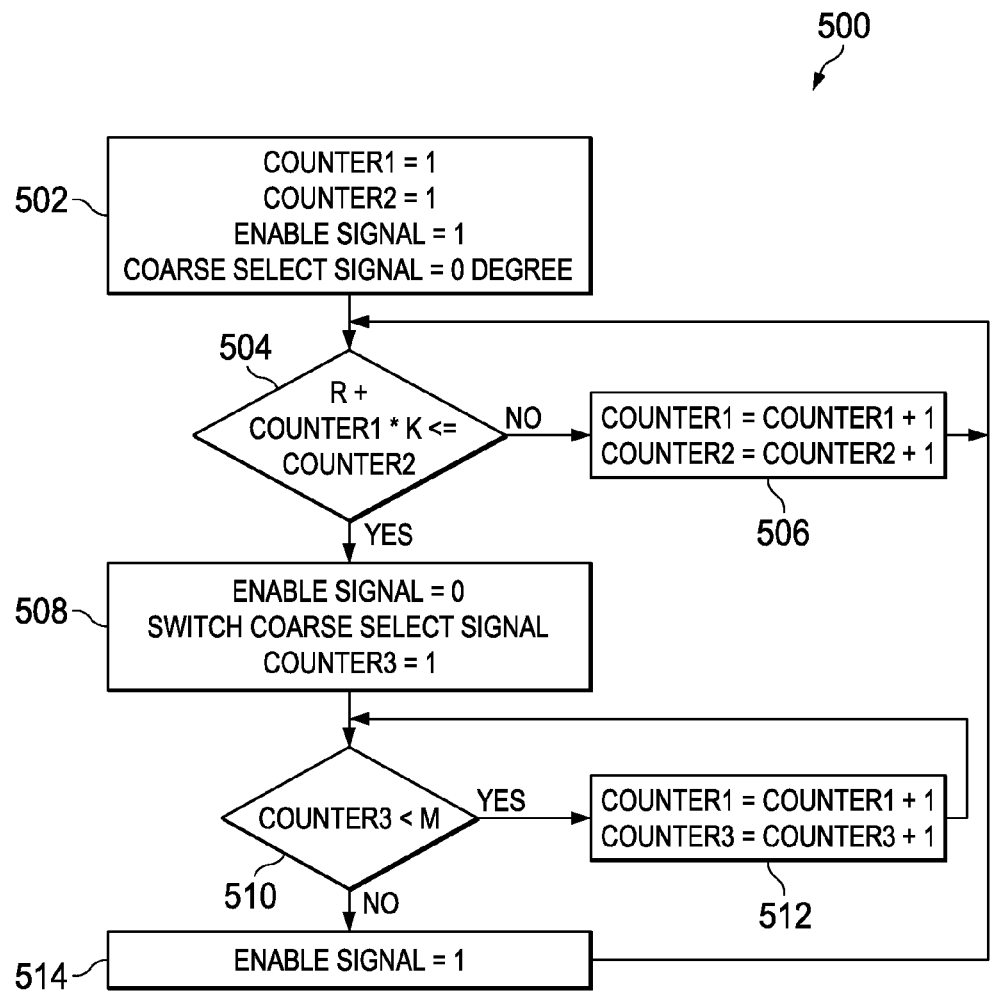
FIG. 5 is a flowchart illustrating a method of generating a gated clock, according to an embodiment.

FIG. 5 is a flowchart 500 illustrating a method of generating a gated clock, according to an embodiment. The flowchart 500 is explained in connection with the clock dithering circuit 100 illustrated in FIG. 1. The flowchart 500 is thus a method followed by the control unit 104. In one example, the flowchart 500 is programmed in the control unit 104. At step 502, a counter1 is initialized at a value 1 and a counter2 is initialized at a value 1. Also the enable signal is at logic high or logic '1'. A coarse select signal of 0 degrees is provided. Counter1 counts a number of positive edges in the input clock CLK and counter2 counts a number of positive edges in the gated clock.

When an input clock CLK has N positive edges, M positive edges of the input clock CLK are gated such that the generated gated clock has N−M positive edges in response to the N positive edges of the input clock CLK. N and M are integers and M is less than N. At step 504, the counter2 is compared to (R+counter1*K). R is a random number that varies between a maximum value and a minimum value. K is a required throughput ratio. K is a ratio of frequency of an output clock and a frequency of the input clock CLK. When counter2 is greater than (R+counter1*K), the system proceeds to step 508, otherwise the system proceeds to step 506. In step 506, both counter1 and counter2 are incremented by 1.

When counter2 is greater than (R+counter1*K), then enable signal transition to logic low or logic '0', at step 508. Also, at step 508, the coarse select signal is switched. The coarse select signal is switch to a defined phase such as 180 degrees in a random way. In addition, a counter3 is initialized at a value 1. At step 510, the counter3 is compared to M. When counter3 is less than M, both counter1 and counter3 are incremented by 1, at step 512.

When counter3 is equal to or greater than M, the enable signal transitions to logic high or logic '1', at step 514. Thereafter, the system proceeds to step 504. This time, a different value of R is used. In one example, counter1 and counter2 are initialized at different values which reduce the bit-width requirement of the counters.

Figure 6:
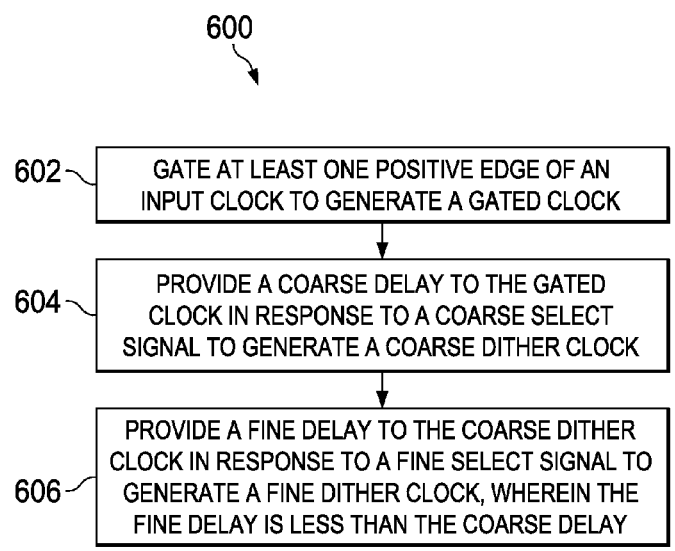
FIG. 6 is a flowchart illustrating a method of clock dithering, according to an embodiment.

FIG. 6 is a flowchart 600 illustrating a method of clock dithering, according to an embodiment. At step 602, at least one positive edge of an input clock is gated to generate a gated clock. In one example, M positive edges of the input clock are gated when the input clock has N positive edges. M is less than N, and M and N are integers. The gated clock thus has N−M positive edges.

At step 604, a coarse delay is provided to the gated clock in response to a coarse select signal to generate a coarse dither clock. The coarse select signal transitions when the input clock is gated. The coarse select signal transitions once during N positive edges of the input clock. In one example, the coarse select signal transitions after a fixed time once the input clock is gated, where the fixed time is greater than a maximum coarse delay provided by the coarse dither unit. At step 606, a fine delay is provided to the coarse dither clock in response to a fine select signal to generate a fine dither clock. The fine delay is less than or equal to the coarse delay. In the above example, the fine select signal is provided at each positive edge of the N−M positive edges of the coarse dither clock to generate the fine dither clock.

A throughput is estimated from at least one of the N, M and a frequency of the input clock CLK. In one version, the throughput is maintained above a define threshold by continuously monitoring a ratio of M and N or by monitoring a number of edges of gated clock as well as that of input clock. The defined threshold is derived from M and N.

Figure 7:
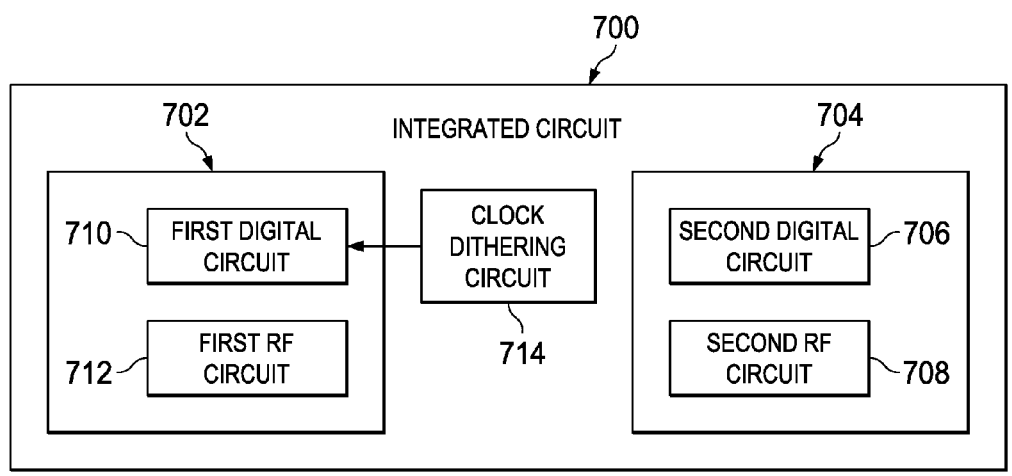
FIG. 7 illustrates a block diagram of an integrated circuit (IC), according to an embodiment.

FIG. 7 illustrates a block diagram of an integrated circuit (IC) 700, according to an embodiment. The IC 700, such as, for example, a multiple radio system on chip (SoC), is configured to implement various embodiments of the present technology. In one embodiment, the multiple radio SoC, hereinafter referred to as "SoC", includes a chip device that combines functionalities of various communication protocols together with their corresponding radio frequency (RF) circuits, such as, for example, GPS, short range wireless communications and frequency modulation (FM) receivers or transmitters.

The IC includes a first circuit 702, for example a GPS circuit and a second circuit 704, for example a FM circuit. The first circuit 702 is capable of being operated on an input clock within an interfering frequency range of the second circuit 704. The first circuit 702 includes a first digital circuit 710, for example a GPS digital circuit and a first RF circuit 712, for example a GPS RF circuit. The second circuit 704 includes a second digital circuit 706, for example, a FM digital circuit and a second radio frequency (RF) circuit 708, for example, a FM RF circuit.

In several embodiments, the first digital circuit 710 generates a spur signal due to digital noise signals and serves as an aggressor circuit. The second RF circuit 708 serves as a victim circuit, such that the spur signal generated by the aggressor circuit lies in a frequency range of operation of the second RF circuit 708. In the present embodiment, a GPS circuit, such as, for example, the first digital circuit 710, is assumed to be an example of the aggressor circuit and a FM circuit, such as, for example, the second RF circuit 708 is assumed to be an example of the victim circuit.

However, the methods and systems disclosed herein may be implemented with reference to other aggressor circuits and victim circuits. Examples of the aggressor circuit and/or victim circuit includes, but are not limited to, a short range wireless communications circuit, a wireless local area network circuit, a global positioning system circuit, a frequency modulation circuit, and a near field communication circuit.

The victim circuit is capable of transmitting a frequency modulated signal in the transmission mode or demodulating a frequency modulated signal in the reception mode. In an example, the victim circuit operates in a predetermined frequency range. In one version, the predetermined frequency range is 76-108 MHz. The first digital circuit 710 operates on the input clock. At least one harmonic of the input clock is within the predetermined frequency range.

A frequency of the input clock, in one example, is 32 MHz. A third harmonic of 32 MHz, that is 96 MHz, act as an aggressor to the second RF circuit 708 as the frequency range of operation of victim circuit is 76-108 MHz, thereby leading to co-existence issues between the first digital circuit 710 and the second RF circuit 708. Therefore, a clock dithering circuit 714 is coupled to the aggressor circuit. The clock dithering circuit 714 is analogous to the clock dithering circuit 100 of FIG. 1, in connection and operation.

The clock dithering circuit 714 receives the input clock and provides a fine dither clock to the first digital circuit 710. The clock dithering circuit 714 provides a dither between 0 degrees and 360 degrees. This ensures good suppression of all the harmonics of input clock. The operation of the clock dithering circuit 714 is similar to the clock dithering circuit 100 and hence is not explained here for brevity of the description. It is noted that the present disclosure is explained using the GPS and FM circuits. However, similar structure and functioning is applicable to any two circuits that interfere with each other in the frequency range of operation in the IC.

In the foregoing discussion, the terms "connected" means at least either a direct electrical connection between the devices connected or an indirect connection through one or more passive intermediary devices. The term "circuit" means at least either a single component or a multiplicity of passive or active components, that are connected together to provide a desired function. The term "signal" means at least one current, voltage, charge, data, or other signal. Also, the terms "coupled to" or "couples with" (and the like) are intended to describe either an indirect or direct electrical connection. Thus, if a first device is coupled to a second device, that connection can be through a direct electrical connection, or through an indirect electrical connection via other devices and connections.

One having ordinary skill in the art will understand that the present disclosure, as discussed above, may be practiced with steps and/or operations in a different order, and/or with hardware elements in configurations which are different than those which are disclosed. Therefore, although the disclosure has been described based upon these preferred embodiments, it should be appreciated that certain modifications, variations, and alternative constructions are apparent and well within the spirit and scope of the disclosure. In order to determine the metes and bounds of the disclosure, therefore, reference should be made to the appended claims.

What is claimed is:

1. A clock dithering circuit comprising:
an input clock signal on an input clock signal lead;
a control unit having a clock input coupled with the input clock signal lead, an enable signal output, a coarse select signal output, and a fine select signal output;
an ICG (integrated clock gating) cell having a clock input coupled with the input clock signal, an enable input coupled with the enable output, and a gated clock signal output, the ICG providing a gated clock signal in phase with the input clock signal during one state of the enable signal and providing no gated clock signal in another state of the enable signal;
a coarse dither unit having a gated clock signal input coupled to the gated clock signal output, a coarse select signal input coupled to the coarse select signal output, and a coarse clock signal output, the coarse dither unit providing a coarse clock signal with a phase shift of either 0 degrees or 180 degrees with respect to the input clock signal in response to coarse select signals of one or another state on the coarse signal input; and
a fine dither unit having a coarse clock signal input coupled to the coarse signal output, a fine select signal input coupled to the fine select signal output, and a fine clock signal output, the fine dither unit providing a fine clock signal with a phase shift of less than that of the coarse dither unit with respect to the input clock signal in response to fine select signals of different states on the fine signal input.

2. The clock dithering circuit of claim 1, in which the ICG cell is configured to generate the gated clock when the enable signal is at logic high.

3. The clock dithering circuit of claim 2, in which enable signal is configured to gate at least one positive edge of the input clock to generate the gated clock.

4. The clock dithering circuit of claim 1, in which the input clock has N positive edges, and the ICG cell is configured to gate M positive edges of the input clock in response to the enable signal, in which M is less than N, and M and N are integers.

5. The clock dithering circuit of claim 4, in which N is between a maximum threshold and a minimum threshold.

6. The clock dithering circuit of claim 4, in which the ICG cell is configured to generate the gated clock with N−M positive edges in response to the N positive edges of the input clock.

7. The clock dithering circuit of claim 4, in which the coarse select signal transition when the input clock is gated, and the coarse select signal transition once during N positive edges of the input clock, and the coarse dither unit is configured to generate the coarse dither clock with N−M positive edges.

8. The clock dithering circuit of claim 7, in which the fine select signal is provided at each positive edge of the N−M positive edges of the coarse dither clock to generate the fine dither clock.

9. The clock dithering circuit of claim 4, in which a throughput is estimated from at least one of the N, M and a frequency of the input clock.

10. The clock dithering circuit of claim 9, in which the throughput is maintained above a defined threshold by continuously monitoring a ratio of M and N.

11. The clock dithering circuit of claim 1, in which the coarse select signal provides a coarse delay to the gated clock to generate the coarse dither clock and the fine select signal provides a fine delay to the coarse dither clock to generate the fine dither clock, in which the fine delay is less than the coarse delay.

12. The clock dithering circuit of claim 1, in which the coarse select signal and the fine select signal combined provides a dither between 0 degrees and 360 degrees to the fine dither clock with respect to the input clock.

13. The clock dithering circuit of claim 1, in which the coarse dither circuit comprises
- a synchronizing flip-flop configured to receive the gated clock and a reference clock, in which a frequency of the reference clock is greater than a frequency of the gated clock;
- one or more delay flip-flop coupled sequentially and each delay flip-flop of the one or more delay flip-flops configured to receive the reference clock, in which a first delay flip-flop of the one or more delay flip-flops configured to receive an output of the synchronizing flip-flop;
- a multiplexer coupled to an output of each delay flip-flop of the one or more delay flip-flops, the multiplexer configured to receive the coarse select signal; and
- an output flip-flop configured to receive an output of the multiplexer and the reference clock, the output flip-flop configured to generate the coarse dither clock.

14. A method of clock dithering comprising:
- gating at least one positive edge of an input clock to generate a gated clock, the gating including providing a gated clock signal in phase with the input clock during one state of an enable signal and providing no gated clock in another state of the enable signal;
- providing a coarse delay to the gated clock in response to a coarse select signal to generate a coarse dither clock, the providing a coarse delay including providing a coarse clock signal with a phase shift of either 0 degrees or 180 degrees with respect to the input clock in response to coarse select signals of one or another state; and
- providing a fine delay to the coarse dither clock in response to a fine select signal to generate a fine dither clock, in which the fine delay is less than the coarse delay, the providing a fine delay including providing a fine clock signal with a phase shift of less than that provided by the coarse delay with respect to the input clock in response to fine select signals of different states.

15. The method of claim 14 including gating M positive edges of the input clock, in which the input clock has N positive edges, M is less than N, and M and N are integers.

16. The method of claim 15 including:
- generating the gated clock having N−M positive edges;
- providing the coarse select signal once during N positive edges of the input clock and when the input clock is gated, to generate the coarse dither clock with N−M positive edges; and
- providing the fine select signal at each positive edge of the N−M positive edges of the coarse dither clock to generate the fine dither clock.

17. The method of claim 15 including estimating a throughput from at least one of the N, M and a frequency of the input clock, and in which the throughput is maintained above a defined threshold by continuously monitoring a ratio of M and N.

18. An integrated circuit comprising:
- a victim circuit operating in a predetermined frequency range;
- an aggressor circuit configured to receive a fine dither clock; and
- a clock dithering circuit coupled to the aggressor circuit, the clock dithering circuit configured to receive an input clock, in which at least one harmonic of the input clock is within the predetermined frequency range, the clock dithering circuit including:
- a control unit having a clock input coupled with the input clock, an enable signal output, a coarse select signal output, and a fine select signal output;
- an ICG (integrated clock gating) cell having a clock input coupled with the input clock, an enable input coupled with the enable output, and a gated clock signal output, the ICG providing a gated clock signal in phase with the input clock signal during one state of the enable signal and providing no gated clock signal in another state of the enable signal;
- a coarse dither unit having a gated clock signal input coupled to the gated clock signal output, a coarse select signal input coupled to the coarse select signal output, and a coarse clock signal output, the coarse dither unit providing a coarse clock signal with a phase shift of either 0 degrees or 180 degrees with respect to the input clock signal in response to coarse select signals of one or another state on the coarse signal input; and
- a fine dither unit having a coarse clock signal input coupled to the coarse signal output, a fine select signal input coupled to the fine select signal output, and a fine clock signal output, the fine dither unit providing a fine clock signal with a phase shift of less than that of the coarse dither unit with respect to the input clock signal in response to fine select signals of different states on the fine signal input.

19. The integrated circuit of claim 18, in which the input clock has N positive edges, and the ICG cell is configured to gate M positive edges of the input clock in response to the enable signal, in which M is less than N, and M and N are integers.

20. The integrated circuit of claim 18, in which:
- the ICG cell is configured to generate the gated clock with N−M positive edges;
- the coarse select signal transitions once during N positive edges of the input clock and when the input clock is gated, to generate the coarse dither clock with N−M positive edges; and
- the fine select signal is provided at each positive edge of the N−M positive edges of the coarse dither clock to generate the fine dither clock.

* * * * *